United States Patent
Suen et al.

(10) Patent No.: US 9,269,585 B2
(45) Date of Patent: Feb. 23, 2016

(54) METHOD FOR CLEANING METAL GATE SURFACE

(71) Applicant: Taiwan Semiconductor Manufacturing Company, Ltd., Hsin-Chu (TW)

(72) Inventors: Shich-Chang Suen, Hsinchu (TW); Li-Chieh Wu, Hsinchu (TW); Chi-Jen Liu, Taipei (TW); He Hui Peng, Changhua (TW); Liang-Guang Chen, Hsinchu (TW); Yung-Chung Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 12 days.

(21) Appl. No.: 14/152,497

(22) Filed: Jan. 10, 2014

(65) Prior Publication Data

US 2015/0200089 A1  Jul. 16, 2015

(51) Int. Cl.
*H01L 21/3205* (2006.01)
*H01L 21/4763* (2006.01)
*H01L 21/28* (2006.01)
*H01L 21/02* (2006.01)
*H01L 21/311* (2006.01)

(52) U.S. Cl.
CPC .... *H01L 21/28132* (2013.01); *H01L 21/02063* (2013.01); *H01L 21/28079* (2013.01); *H01L 21/31105* (2013.01)

(58) Field of Classification Search
CPC ............... H01L 21/02074; H01L 21/28079; H01L 21/28132; H01L 21/76802; H01L 21/76832; H01L 21/76834; H01L 21/2807; H01L 21/7685; H01L 21/76856; H01L 21/76886; H01L 21/76888
See application file for complete search history.

(56) References Cited

U.S. PATENT DOCUMENTS

| | | | | |
|---|---|---|---|---|
| 5,269,880 | A * | 12/1993 | Jolly et al. | 438/701 |
| 5,972,804 | A * | 10/1999 | Tobin et al. | 438/786 |
| 6,001,716 | A * | 12/1999 | Liao | 438/585 |
| 6,015,724 | A | 1/2000 | Yamazaki | |
| 7,732,284 | B1 * | 6/2010 | Kirkpatrick et al. | 438/287 |
| 8,877,651 | B2 * | 11/2014 | Han et al. | 438/720 |
| 2013/0187203 | A1 | 7/2013 | Xie et al. | |
| 2013/0200461 | A1 | 8/2013 | Liu et al. | |

OTHER PUBLICATIONS

Zhou, Bo and Ramirez, W. Fred; "Kinetics and Modeling of Wet Etching of Aluminum Oxide by Warm Phosphoric Acid"; Feb. 1996; The Electrochemical Society, Inc.; J. Electrochem. Soc., vol. 143, No. 2; Feb. 1996; pp. 619-623).*

* cited by examiner

*Primary Examiner* — Stephen W Smoot
*Assistant Examiner* — Vicki B Booker
(74) *Attorney, Agent, or Firm* — Haynes and Boone, LLP

(57) ABSTRACT

The present disclosure provides a method for forming an integrated circuit (IC) structure. The method includes providing a metal gate (MG), an etch stop layer (ESL) formed on the MG, and a dielectric layer formed on the ESL. The method further includes etching the ESL and the dielectric layer to form a trench. A surface of the MG exposed in the trench is oxidized to form a first oxide layer on the MG. The method further includes removing the first oxide layer using a $H_3PO_4$ solution.

20 Claims, 11 Drawing Sheets

METHOD FOR CLEANING METAL GATE SURFACE

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease.

Accordingly, an improved method for fabricating a semiconductor device including a metal gate is desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In addition, although the present disclosure provides examples may be used in a "gate last" metal gate process, one skilled in the art may recognize applicability of the present invention to other processes of fabricating the gate structure, and/or use of other materials in the gate structure.

Figure 1:
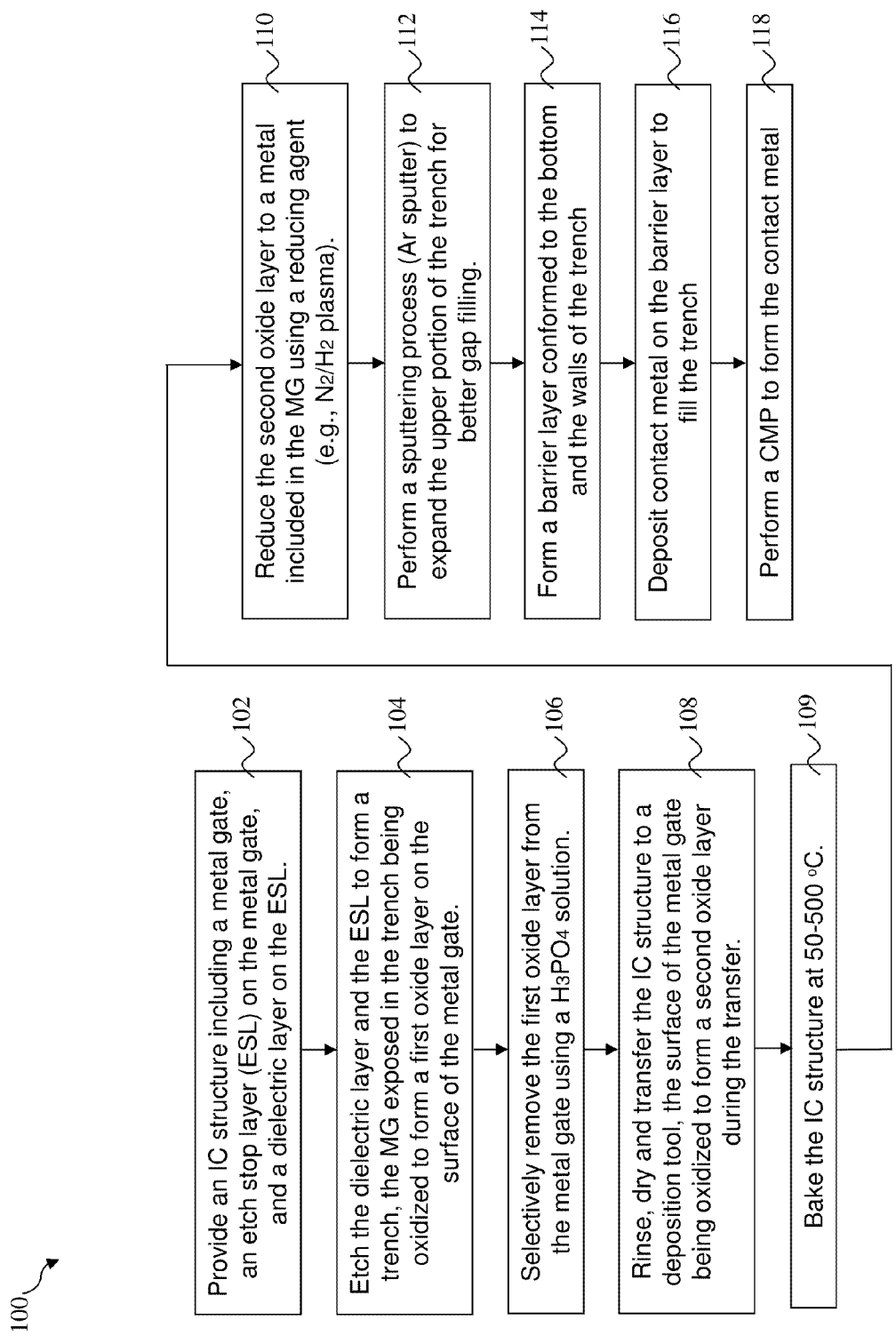
FIG. 1 is a flowchart illustrating a method for fabricating an integrated circuit (IC) structure according to some embodiments of the present disclosure.

FIG. 1 is a flowchart illustrating a method 100 for fabricating an integrated circuit (IC) structure according to some embodiments of the present disclosure. It should be understood that additional processes may be provided before, during, and after the method 100 of FIG. 1, and that some other processes may be briefly described herein. FIGS. 2-12 are cross-sectional views of an IC structure 200 at various stages of fabrication using the method 100 of FIG. 1 according to some embodiments of the present disclosure. It should be noted that the IC structure 200 may be formed as part of a semiconductor device and may be fabricated with a CMOS process flow.

Figure 2:
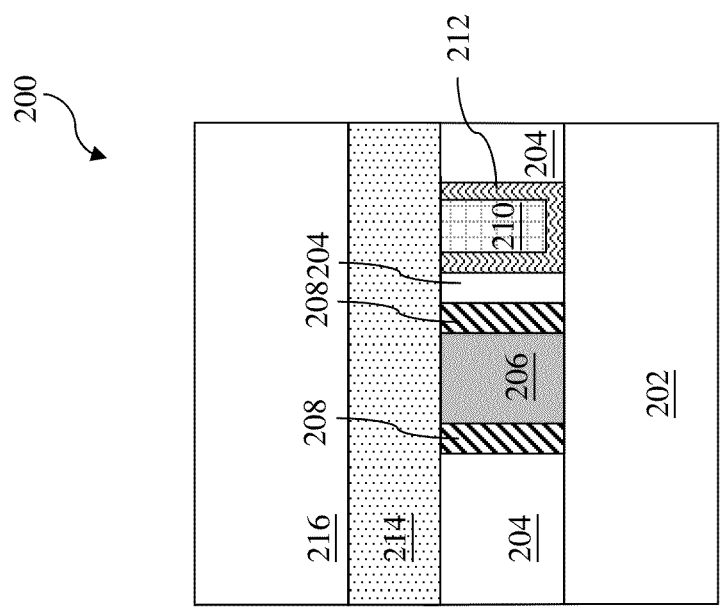
FIGS. 2-11 are cross-sectional views of an IC structure at various stages of fabrication using the method of FIG. 1 according to some embodiments of the present disclosure.

Referring to FIGS. 1 and 2, the method 100 begins with step 102 by providing the IC structure 200. As shown in FIG. 2, the IC structure 200 includes a substrate 202, a first dielectric layer 204 disposed on the substrate 202, an etch stop layer (ESL) 214 formed on the first dielectric layer 204, and a second dielectric layer 216 formed on the ESL 214. As shown in FIG. 2, a metal gate (MG) 206 including sidewall spacers 208 may be formed in the first dielectric layer 204. The first dielectric layer 204 may also include a conductive feature 210 and a barrier layer 212 formed to wrap around the conductive feature 210.

In some embodiments, the substrate 202 may be a silicon wafer. The substrate 202 may also include another elementary semiconductor, such as germanium; a compound semiconductor including silicon carbide, gallium arsenic, gallium phosphide, indium phosphide, indium arsenide, and/or indium antimonide; or an alloy semiconductor including SiGe, GaAsP, AlInAs, AlGaAs, GaInAs, GaInP, and/or GaInAsP. In some alternative embodiments, the substrate 202 includes a semiconductor on insulator (SOI). In some embodiments, a dielectric layer may be formed over the substrate 202. In some embodiments, the dielectric layer may include silicon oxide. In some embodiments, the dielectric layer may additionally or alternatively include silicon nitride, silicon oxynitride, or other suitable dielectric material.

The substrate 202 may also include various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 202 may further include other functional features such as a resistor or a capacitor formed in and on the substrate. In some embodiments, the substrate 202 may further include lateral isolation features provided to separate various devices formed in the substrate 202. The isolation features may include shallow trench isolation (STI) features to define and electrically isolate the functional features. In some examples, the isolation regions may include silicon oxide, silicon nitride, silicon oxynitride, an air gap, other suitable materials, or combinations thereof. The isolation regions may be formed by any suitable process. The various IC structures 200 may further include other features, such as silicide disposed on S/D and gate stacks overlying channels.

Referring to FIG. 2, the first dielectric layer 204 may be an interlayer dielectric (ILD) layer. In some embodiments, the first dielectric layer 204 may include silicon oxide, silicon nitride, silicon oxynitride, fluoride-doped silicate glass (FSG), a low-k dielectric material, and/or other suitable insulating material. In some embodiments, the first dielectric layer 204 may include a single layer or multiple layers. In some embodiments, the first dielectric layer 204 may be formed using a suitable technique, such as chemical vapor deposition (CVD), atomic layer deposition (ALD), and spin-on technique.

Still referring to FIG. 2, the MG 206 may include aluminum (Al), tungsten (W), copper (Cu), or other suitable metal material. In some examples, the MG 206 may be formed using a gate last process (also referred to as a replacement poly gate process (RPG)). In the gate last process, a dummy dielectric and dummy poly gate structure may be initially formed and may be followed by a normal CMOS process flow until deposition of the ILD 204. The dummy dielectric and dummy poly gate structure may then be removed using a suitable etching process and replaced with a high-k gate dielectric/metal gate structure. In some embodiments, the high-k gate dielectric/metal gate structure may include an interface layer, a gate dielectric layer, a work function layer, and the MG 206. The MG 206 may be deposited by CVD, physical vapor deposition (PVD), electrochemical plating (ECP), or other suitable process. Excess metal may then be removed by a chemical mechanical polishing (CMP) process to produce a planar surface of the dielectric layer 204, the MG 206, and/or the conductive feature 210. In some alternative examples, the metal gate (MG) layer 206 may be formed using any suitable process.

The sidewall spacers 208 may be formed on the sidewalls of the MG 206. The spacers 208 may be formed of silicon oxide, silicon nitride, silicon oxynitride, silicon carbide, fluoride-doped silicate glass (FSG), a low-k dielectric material, combinations thereof, and/or other suitable material. The spacers 208 may have a multiple layer structure, for example, including one or more liner layers. The liner layer may include a dielectric material such as silicon oxide, silicon nitride, and/or other suitable materials. The spacers 208 may be formed by methods including deposition of suitable dielectric material and anisotropically etching the material to form the spacer 208 profile.

Still referring to FIG. 2, the conductive feature 210 may include a metal contact, a metal via, or a metal line. In some embodiments as shown in FIG. 2, the conductive feature 210 may be further surrounded by a barrier layer 212 to prevent diffusion and/or provide material adhesion. In some examples, the conductive feature 210 may include aluminum (Al), copper (Cu) or tungsten (W). The barrier layer 206 may include titanium nitride (TiN), tantalum nitride (TaN), tungsten nitride (WN), titanium silicon nitride (TiSiN) or tantalum silicon nitride (TaSiN). The barrier layer 212 may include metal that is electrically conductive but does not permit interdiffusion and reactions between the second dielectric layer 204 and the conductive feature 210. The barrier layer 212 may include refractory metals and their nitrides. In various examples, the barrier layer 212 includes TiN, TaN, Co, WN, TiSiN, TaSiN, or combinations thereof. The conductive feature 210 and the barrier layer 212 may be formed by a procedure including lithography, etching and deposition. For example, the conductive feature 210 and the barrier layer 212 may be deposited by PVD, CVD, metal-organic chemical vapor deposition (MOCVD), and ALD, or other suitable technique. In some alternative embodiments, the conductive feature 210 includes an electrode of a capacitor, a resistor or a portion of a resistor. In some examples, the conductive feature 210 includes a silicide feature disposed on respective source, drain or gate electrode. The silicide feature may be formed by a self-aligned silicide (salicide) technique. A CMP process may be used to form a coplanar surface of the dielectric layer 204 and the conductive feature 210. In some embodiments, a cap layer may be formed on the conductive feature 210.

As shown in FIG. 2, the ESL 214 is formed on the first dielectric layer 204. In some embodiments, the ESL 214 includes a dielectric material chosen to have etching selectivity for proper etch process at subsequent processes to form contact trenches. In some embodiments, the ESL 214 may include silicon nitride ($Si_3N_4$), silicon oxynitride, titanium nitride, and/or other suitable materials. In some embodiments, the ESL 214 may be deposited using any suitable technique, such as CVD, physical vapor deposition (PVD), ALD, or an epitaxial growing process. In some embodiments, the thickness of the ESL 214 is in a range from about 10 Å to about 300 Å.

After forming the ESL 214, the second dielectric layer 216 is formed on the ESL 214. The materials included in the second dielectric layer 216 may be substantially similar to the materials included in the first dielectric layer 204. The formation of the second dielectric layer 216 may be substantially similar to the first dielectric layer 204.

Figure 3:
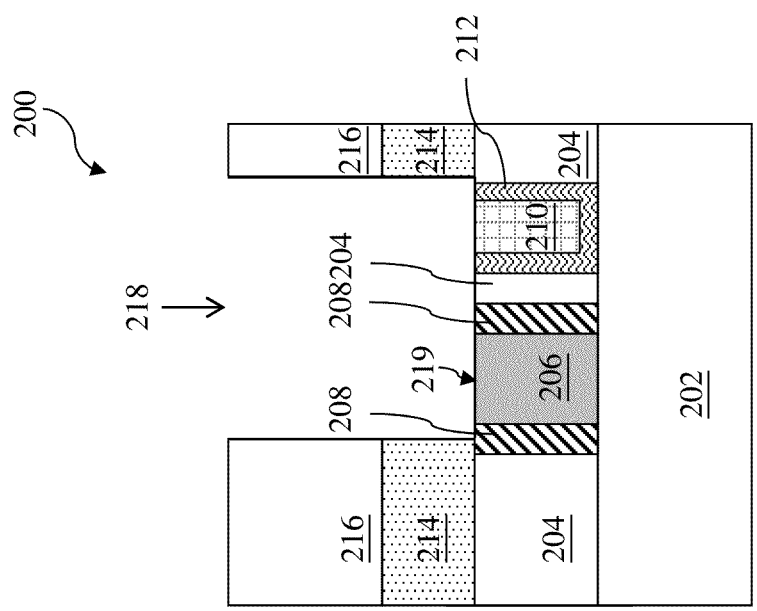

Referring to FIGS. 1 and 3, method 100 proceeds to step 104 by etching the second dielectric layer 216 and the ESL 214 to form a trench 218. In some embodiments, the trench 218 may be formed by a lithography process and an etching process including one or more etching steps. The lithography process is used to pattern the second dielectric layer 216. In some examples, the etching process includes a first etch step to remove the second dielectric layer 216 in the contact regions using a dry etch process with a fluorine-containing etchant, such as difluoromethane ($CH_2F_2$) plasma. The first etch step may stop at the ESL 214. Then a second etch step is used to selectively remove the ESL 214 in the contact regions using a wet etch with a suitable etchant without etching the MG 206 and the conductive feature 210 in the first dielectric layer 204 as shown in FIG. 3.

Figure 4:
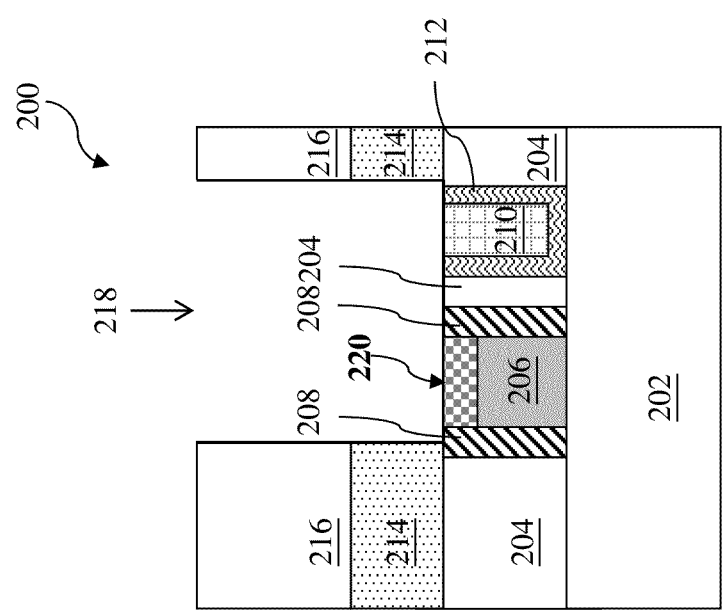

As shown in FIG. 3, after etching to form the trench 218 at step 104, a top surface 219 of the MG 206 is exposed by the opening of the trench 218. As shown in FIG. 4, the metal materials on the top surface 219 may be oxidized to form a first oxide layer 220 during the etching process and/or during the transfer process before the IC structure 200 is transferred into a metal contact deposition tool. In some embodiments, the thickness of the first oxide layer 220 is in a range from about 40 Å to about 90 Å. In some examples, the MG 206 includes Al, and the first oxide layer 220 includes $Al_2O_3$. The formed $Al_2O_3$ between the MG 206 and the later deposited metal contact may increase the contact resistance thus reduce the performance and reliability of the IC structure 200. Therefore, it is necessary to remove the first oxide layer 220 before the IC structure 200 is transferred into the metal contact deposition tool.

Figure 5:
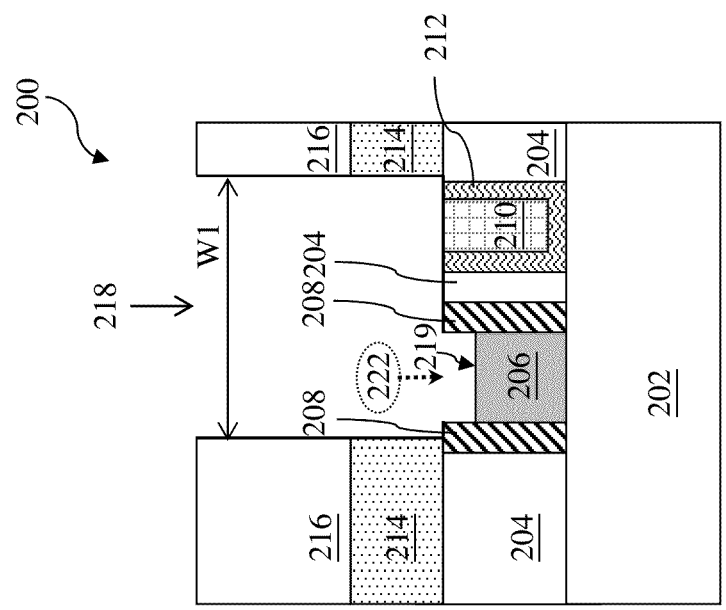

Referring to FIGS. 1 and 5, method 100 proceeds to step 106 by removing the first oxide layer 220 formed on the top surface of the MG 206. In some examples, the first oxide layer 220 may be removed using an argon (Ar) sputter bombardment. However, this method may result in a chopping profile of the trench 218, where the width W1 of the upper portion of the trench 218 is over widened. The over widening of the trench 218 may cause lateral electrical leak if the later deposited metal contact is under polished. In addition, in the region with high pattern density, the over widening of the trench 218 may result in different thickness between the ILD and the isolation regions. In some alternative examples, the first oxide layer 220 may be removed using a wet etching process including using dilute hydrofluoric (HF) acid. However, due to the low selectivity of the HF between Al and $Al_2O_3$, the MG 206, and even the functional metal beneath the MG gate 206 may be damaged during the wet etching process.

Still referring to FIG. 5 at step 106, the first oxide layer 220 may be removed by a wet etching process using an acid solution 222 with high selectivity between the metal in the MG 206 (e.g., Al) and the first oxide layer 220 (e.g., $Al_2O_3$) to etch the first oxide layer. In some embodiments, the acid solution 222 includes a phosphoric acid ($H_3PO_4$) solution due to the high selectivity between Al and $Al_2O_3$. In some embodiments, the $Al_2O_3$ may be removed by the $H_3PO_4$ solution using a reaction as shown in equation 1:

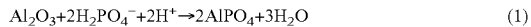

$$Al_2O_3 + 2H_2PO_4^- + 2H^+ \rightarrow 2AlPO_4 + 3H_2O \quad (1)$$

In some embodiments, the $H_3PO_4$ solution includes $H_3PO_4$ dissolved in de-ionized water (DIW) with a concentration in a range from about 5% to about 25%. The temperature of the $H_3PO_4$ solution may be no greater than 50° C. The time using the $H_3PO_4$ solution to clean the surface of the MG 206 may be in a range from about 5 seconds to about 180 seconds. Because the $H_3PO_4$ solution used to remove the oxide layer on the MG 206 has high selectivity between Al and $Al_2O_3$, the MG 206 may not be damaged and the chopping effect can be avoided during the surface clean process. After the removal of the first oxide layer 220, the top surface of the 219 of the MG 206 can be exposed as shown in FIG. 5.

Figure 6:
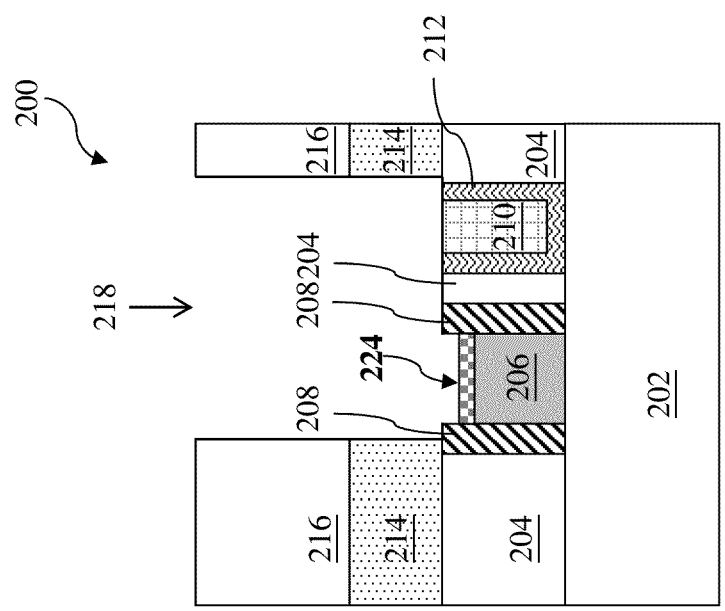

Referring to FIGS. 1 and 6, method 100 proceeds to step 108 by rinsing, drying and transferring the IC structure 200 to the metal gate deposition tool. After cleaning the IC structure with the $H_3PO_4$ solution to remove the first oxide layer in step 106, the IC structure 200 may be rinsed with DIW, and spin-dried before the subsequent processes. In some embodiments, the metal contact deposition tool includes a PVD tool including one or more deposition/sputtering chambers that are connected to each other. For example, the IC structure 200 may be transferred to a pre-sputter chamber that is connected to the metal contact deposition chamber. In some embodiments, during the transferring process of the IC structure 200, the metal materials on the top surface 219 may be oxidized to form a second oxide layer 224. The second oxide layer 224 may be a native oxide layer which is formed when the MG 206 is exposed to the air in the ambient condition. In some embodiments, the thickness of the second oxide layer 224 is in a range from about 10 Å to about 30 Å. In some examples, the MG 206 includes Al, and the second oxide layer 224 includes $Al_2O_3$.

Referring to FIGS. 1 and 6, method 100 proceeds to step 109 by baking the IC structure 200 under vacuum in the pre-sputter chamber at a temperature in a range from about 50° C. to about 500° C. to remove the moisture and any organic chemical residue on the IC structure 200.

Figure 7:
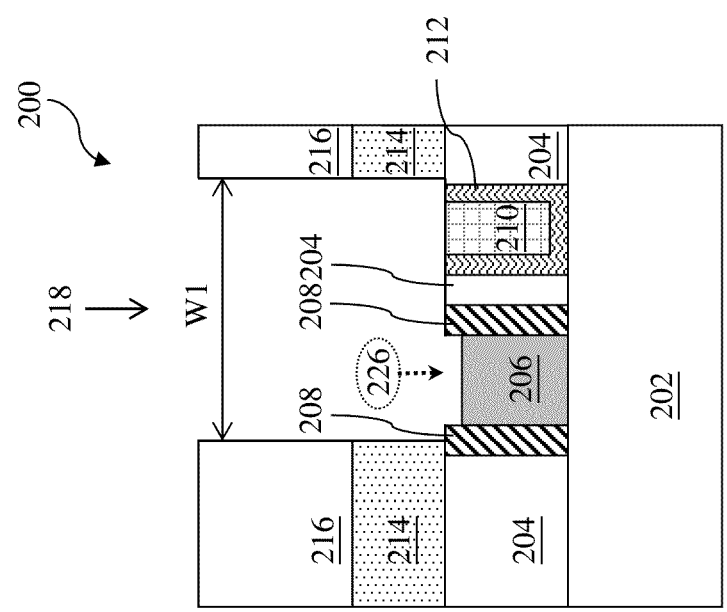

Referring to FIGS. 1 and 7, method 100 proceeds to step 110 by reducing the second oxide layer 224 (e.g., $Al_2O_3$ layer) to a metal (e.g., Al) included in the MG 206. In some embodiments, the second oxide layer 224 may be reduced using a reducing agent 226, such as nitrogen/hydrogen ($N_2/H_2$) plasma, in the pre-sputter chamber of the metal contact deposition tool. The $N_2/H_2$ plasma is used as a chemical reactive agent that is used to reduce the second oxide layer 224 in the IC structure 200. The $N_2/H_2$ plasma includes $H_2^+$, $H^+$, H., $N_2^+$, $N^+$, N., and the $Al_2O_3$ may be reduced to Al by a reaction as shown in equation 2:

$$Al_2O_3 + 3N_2/H_2(H_2^+, H^+, H., N_2^+, N^+, N.) \rightarrow 2Al + 3H_2O \quad (2)$$

In some embodiments during reduction of the second oxide layer 224, the flow rate of the $N_2$ is in a range from about 1000 sccm to about 4000 sccm. The flow rate of the $H_2$ is in a range from about 100 sccm to about 500 sccm. The pressure of the chamber for reducing the second oxide layer may be controlled to be in a range from about 10 mTorr to about 3000 mTorr. The plasma power is in a range from about 100 W to about 2000 W. During the reducing process using the $N_2/H_2$ plasma, a bias power in a range from about 5 W to about 1500 W is applied to the substrate of the IC structure 200, so that the charged molecules and ions in the $N_2/H_2$ plasma can be introduced to the substrate to react with the second oxide layer (e.g., $Al_2O_3$ layer) of the IC structure 200 as shown in equation 2. In some embodiments, the surface reduction process using the $N_2/H_2$ plasma treatment may be conducted at a temperature in a range from about 50° C. to about 500° C. The treatment time may be in a range from about 10 seconds to about 240 seconds.

At step 110, the $N_2/H_2$ plasma can effectively reduce the $Al_2O_3$ layer on the surface of the MG 206 to Al without damaging the MG 206. The chopping effect can be minimized so that the process window of the IC structure can be improved. In some embodiments, when the dielectric layer 216 includes an organic material, the $N_2/H_2$ plasma treatment may also expand the upper portion of the trench 218, so that the width W1 of the upper portion of the trench 218 may become slightly greater after reducing the second oxide layer 224 using the $N_2/H_2$ plasma. The expansion effect of the trench 218 at step 110 can be tuned by adjusting the condition of the $N_2/H_2$ plasma treatment.

Figure 8:
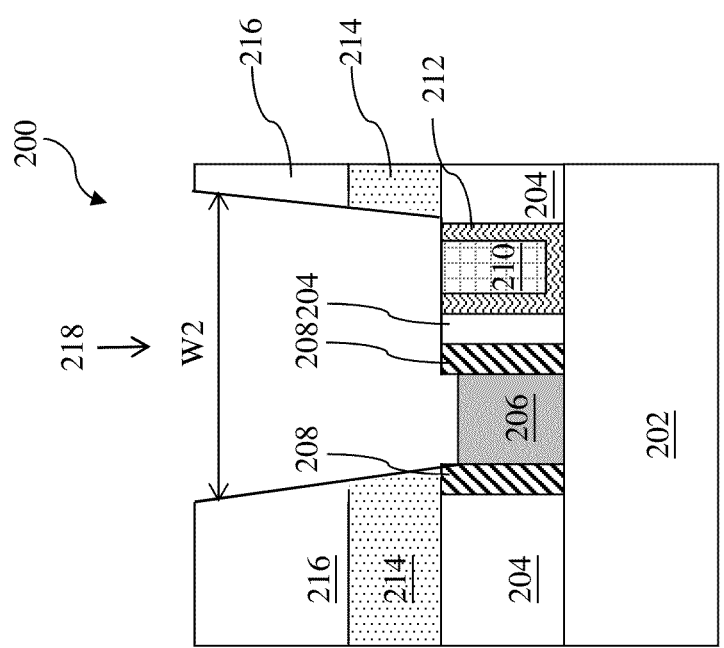

Referring to FIGS. 1 and 8, method 100 proceeds to an optional step 112 by performing an Ar sputtering process in a sputtering chamber of the metal contact deposition tool. The sputtering chamber may be connected to the pre-sputter chamber and the metal contact deposition chamber, so that the IC structure 200 can be transferred among the chambers of the metal contact deposition tool without being exposed to the ambient environment. In some embodiments, the Ar sputtering process may be performed in the pre-sputter chamber. In order to provide a better gap filling in the following processes, the width W1 of the upper portion of the trench 218 may be expanded to a width W2, where W2 is greater than W1. In some embodiments, the width W2 is in a range from about 5% to about 20% greater than the width W1. In some embodiments, the sputtering process includes using an Ar ion bombardment. For example, a bias power in a range from about 50 W to about 1000 W is applied to the substrate of the IC structure 200, so that the charged ions and molecules in the Ar plasma can bombard the walls of the trench 218 to expand the trench 218 as shown in FIG. 8. In some embodiments, the Ar flow rate is in a range from about 5 sccm to about 100 sccm. The pressure of the sputter chamber may be in a range from about 0.01 mTorr to about 100 mTorr. The plasma power is in a range from about 50 W to about 1000 W. The Ar sputtering process may be performed in a temperature range from about room temperature (RT) to about 200° C.

Figure 9:
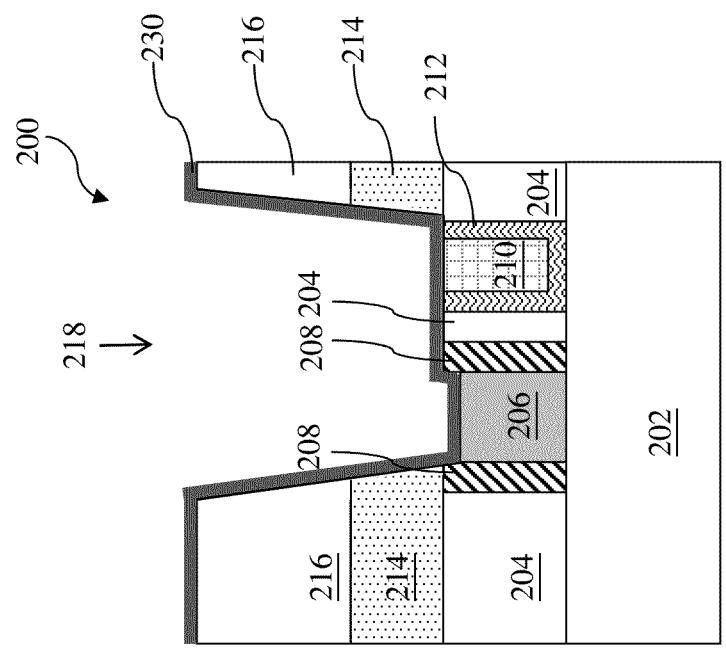

Referring to FIGS. 1 and 9, method 100 proceeds to step 114 by forming a barrier layer 230 conformed to the bottom and the walls of the trench 218. In some embodiments, the barrier layer 230 includes a metal and is electrically conductive but does not permit inter-diffusion and reactions between the dielectric layer 216 and the metal contact to be filled in the trench 218. The barrier layer 230 may include refractory metals and their nitrides. In various examples, the barrier layer 230 includes TiN, TaN, Co, WN, TiSiN, TaSiN, or combinations thereof. In some embodiments, the barrier layer 230 may include multiple films. For example, Ti and TiN films may be used as the barrier layer 230. In some embodiments, the barrier layer 230 may be deposited by PVD, CVD, metal-organic chemical vapor deposition (MOCVD), ALD, sputtering, or other suitable technique. The barrier layer 230 may be deposited in the metal contact deposition chamber of the metal contact deposition tool.

Figure 10:
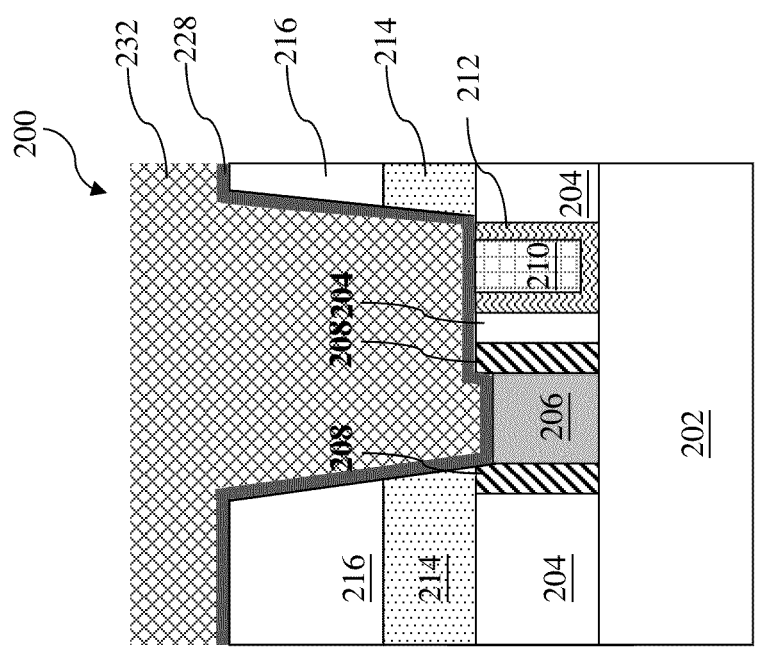

Referring to FIGS. 1 and 10, method 100 proceeds to step 116 by depositing a metal layer 232 on the barrier layer 230 to fill the trench 218 of FIG. 9. In some embodiments, the metal layer 232 may include copper (Cu), aluminum (Al), tungsten (W) or other suitable conductive material. In some embodiments, the metal layer 232 may also include Cu or Cu alloy, such as copper magnesium (CuMn), copper aluminum (CuAl) or copper silicon (CuSi). In some embodiments, the metal layer 232 may be deposited by PVD. In some examples, the metal layer 232 may include Cu, and the Cu layer may be formed by depositing a Cu seed layer using PVD, and then forming a bulk Cu layer by plating. The metal layer 232 is deposited in the metal contact deposition chamber of the metal contact deposition tool. During the metal contact deposition, a carrier gas (e.g., Ar gas) may be used to bombard a metal target to form a metal vapor. The metal vapor can then be deposited to form the metal layer 232 on the IC structure. In some embodiments, the metal layer 232 may include a metal contact, a metal via, or a metal line.

Figure 11:
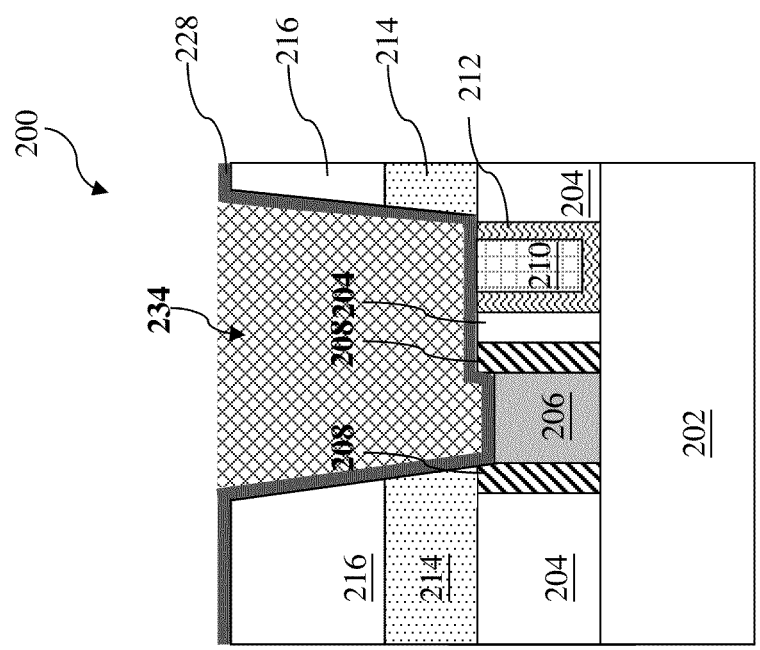

Referring to FIGS. 1 and 11, method 100 proceeds to step 118 by performing a chemical mechanical polishing (CMP) process to remove excessive metal layer 232 to form a metal contact 234 in the trench 218. A substantially coplanar top surface of the metal contact 234 and the dielectric layer 216 is formed. The CMP process is performed in a CMP tool. The CMP process may include polishing, cleaning, and drying processes. After the CMP process, the IC structure 200 may be transferred out of the CMP tool for subsequent processes.

It is to be understood that the IC structure 200 may include a plurality of dielectric layers and conductive features (e.g., metal lines, metal plugs, and MG) integrated to form an interconnect structure configured to couple the various p-type and n-type doped regions and the other functional features (such as gate electrodes), resulting a functional integrated circuit. In some embodiments, the interconnect structure includes a multi-layer interconnect (MLI) structure and an inter-level dielectric (ILD) integrated with the MLI structure, providing an electrical routing to couple various devices in the substrate 202 to the input/output power and signals. In some embodiments, the interconnect structure includes various metal lines, contacts and via features (or via plugs). The metal lines provide horizontal electrical routing. The contacts provide vertical connection between the substrate 202 and metal lines while via features provide vertical connection between metal lines in different metal layers.

Although Al metal gate is used an example for the discussion in the present invention, it is to be understood that the present disclosure can be implemented in an IC structure including a MG with any other kind of suitable metal materials having a corresponding oxide layer formed on the surface of the MG. The acid solution 222 used at step 106 and/or the reducing agent 226 used at step 110 may be chosen to effectively remove the corresponding oxide layer without damaging the MG or affecting the pattern profile.

The present disclosure provides a method for forming an integrated circuit (IC) structure. The method includes providing a metal gate (MG), an etch stop layer (ESL) formed on the MG, and a dielectric layer formed on the ESL. The method further includes etching the ESL and the dielectric layer to form a trench. A surface of the MG exposed in the trench is oxidized to form a first oxide layer on the MG. The method further includes removing the first oxide layer using a $H_3PO_4$ solution.

In some embodiments, the MG includes aluminum (Al), and the first oxide layer includes aluminum oxide ($Al_2O_3$). The thickness of the first oxide layer is in a range from about 40 Å to about 90 Å. The $H_3PO_4$ solution includes $H_3PO_4$ dissolved in de-ionized water with a concentration in a range from about 5% to about 25%. The $Al_2O_3$ is removed by the $H_3PO_4$ solution using a reaction: $Al_2O_3 + 2H_2PO_4^- + 2H^+ \rightarrow 2AlPO_4 + 3H_2O$.

In some embodiments, the method further includes transferring the IC structure to a deposition tool. The surface of the MG is oxidized to form a second oxide layer during the transfer. The method also includes baking the IC structure under vacuum at a temperature in a range from about 50° C. to about 500° C.; and reducing the second oxide layer to a metal included in the MG using a reducing agent. In some embodiments, the MG includes aluminum (Al), and the first oxide layer and the second oxide layer include $Al_2O_3$. In some embodiments, the thickness of the second oxide layer is in a range from about 10 Å to about 30 Å. In some embodiments, the method further includes performing an Ar sputtering process to expand an upper portion of the trench.

In some embodiments, reducing the second oxide layer includes using a nitrogen/hydrogen ($N_2/H_2$) plasma. The $Al_2O_3$ is reduced to Al by a reaction $Al_2O_3 + 3N_2/H_2 \rightarrow 2Al + 3H_2O$. In some embodiments, a flow rate of the $H_2$ is in a range from about 100 sccm to about 500 sccm, and a flow rate of the $N_2$ is in a range from about 1000 sccm to about 4000 sccm. In some embodiments, the reducing the second oxide layer is conducted in a pressure range from about 10 mTorr to about 3000 mTorr. In some embodiments, the reducing the second oxide layer includes using a power of the $N_2/H_2$ plasma in a range from about 100 W to about 2000 W.

In some embodiments, the method further includes forming a barrier layer conformed to a bottom and walls of the trench; depositing a metal layer on the barrier layer to fill the trench; and performing a chemical mechanical polishing (CMP) process to form a contact metal in the trench. The contact metal and the dielectric layer are coplanar after the CMP process.

The present disclosure also provides a method for forming an integrated circuit (IC) structure. The method comprises providing a metal gate (MG), an etch stop layer (ESL) formed on the MG, and a dielectric layer formed on the ESL. The method also includes etching the ESL and the dielectric layer to form a trench to expose a surface of the MG; cleaning the surface of the MG using a $H_3PO_4$ solution; cleaning the surface of the MG using a nitrogen/hydrogen ($N_2/H_2$) plasma; forming a barrier layer conformed to a bottom and walls of the trench; depositing a metal layer on the barrier layer to fill the trench; and performing a chemical mechanical polishing (CMP) process to form a contact metal in the trench. The contact metal and the dielectric layer re coplanar after the CMP process.

In some embodiments, after cleaning the surface of the MG using the $N_2/H_2$ plasma, the method further comprises performing an Ar sputtering process to expand an upper portion of the trench. In some embodiments, after cleaning the surface of the MG using a $H_3PO_4$ solution, the method further comprises rinsing the IC structure using de-ionized water; and spin drying the IC structure.

The present disclosure also discloses a method for forming an integrated circuit (IC) structure. The method includes providing a metal gate (MG), an etch stop layer (ESL) formed on the MG, and a dielectric layer formed on the ESL. The method also includes etching the ESL and the dielectric layer to form a trench. A surface of the MG exposed in the trench is oxidized to form a first oxide layer on the MG. The method also includes removing the first oxide layer using a $H_3PO_4$ solution; transferring the IC structure to a deposition tool. The surface of the MG is oxidized to form a second oxide layer during the transfer. The method further includes baking the IC structure in the deposition tool at a temperature in a range from about 50° C. to about 500° C.; reducing the second oxide layer to a metal included in the MG using a nitrogen/hydrogen (N$_2$/H$_2$) plasma in the deposition tool; performing an Ar sputtering process to expand an upper portion of the trench in the deposition tool; forming a barrier layer conformed to a bottom and walls of the trench in the deposition tool; depositing a metal layer on the barrier layer to fill the trench in the deposition tool; and performing a chemical mechanical polishing (CMP) process to form a contact metal in the trench. The contact metal and the dielectric layer are coplanar after the CMP process. In some embodiments, the MG includes aluminum (Al), and the first oxide layer and the second oxide layer include Al$_2$O$_3$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated circuit (IC) structure, comprising:
providing a metal gate (MG), an etch stop layer (ESL) formed on the MG, and a dielectric layer formed on the ESL;
etching the ESL and the dielectric layer to form a trench, a surface of the MG exposed in the trench being oxidized to form a first oxide layer on the MG;
removing the first oxide layer using a H$_3$PO$_4$ solution;
transferring the IC structure to a deposition tool, the surface of the MG being oxidized to form a second oxide layer during the transfer;
baking the IC structure under vacuum at a temperature in a range from about 50° C. to about 500° C.; and
reducing the second oxide layer to a metal included in the MG using a reducing agent.

2. The method of claim 1, wherein the MG includes aluminum (Al), and wherein the first oxide layer includes aluminum oxide (Al$_2$O$_3$).

3. The method of claim 2, wherein the Al$_2$O$_3$ is removed by the H$_3$PO$_4$ solution using a reaction:

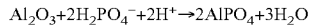

Al$_2$O$_3$+2H$_2$PO$_4^-$+2H$^+$→2AlPO$_4$+3H$_2$O

4. The method of claim 1, wherein the thickness of the first oxide layer is in a range from about 40 Å to about 90 Å.

5. The method of claim 1, wherein the H$_3$PO$_4$ solution includes H$_3$PO$_4$ dissolved in de-ionized water with a concentration in a range from about 5% to about 25%.

6. The method of claim 1, wherein the MG includes aluminum (Al), and wherein the first oxide layer and the second oxide layer include Al$_2$O$_3$.

7. The method of claim 1, wherein the thickness of the second oxide layer is in a range from about 10 Å to about 30 Å.

8. The method of claim 1, further comprising:
performing an Ar sputtering process to expand an upper portion of the trench.

9. The method of claim 1, wherein reducing the second oxide layer includes using a nitrogen/hydrogen (N$_2$/H$_2$) plasma.

10. The method of claim 9, wherein the reducing the second oxide layer includes using a power of the N$_2$/H$_2$ plasma in a range from about 100 W to about 2000 W.

11. The method of claim 9, wherein the Al$_2$O$_3$ is reduced to Al by a reaction:

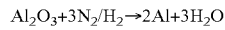

Al$_2$O$_3$+3N$_2$/H$_2$→2Al+3H$_2$O

12. The method of claim 11, wherein a flow rate of the H$_2$ is in a range from about 100 sccm to about 500 sccm, and wherein a flow rate of the N$_2$ is in a range from about 1000 sccm to about 4000 sccm.

13. The method of claim 1, wherein the reducing the second oxide layer is conducted in a pressure range from about 10 mTorr to about 3000 mTorr.

14. The method of claim 1, further comprising:
forming a barrier layer conformed to a bottom and walls of the trench;
depositing a metal layer on the barrier layer to fill the trench; and
performing a chemical mechanical polishing (CMP) process to form a contact metal in the trench, the contact metal and the dielectric layer being coplanar after the CMP process.

15. A method for forming an integrated circuit (IC) structure, comprising:
providing a metal gate (MG), an etch stop layer (ESL) formed on the MG, and a dielectric layer formed on the ESL;
etching the ESL and the dielectric layer to form a trench to expose a surface of the MG;
forming a first oxide layer on the surface of the MG;
cleaning the surface of the MG using a H$_3$PO$_4$ solution to remove the first oxide layer to expose the surface;
forming a second oxide layer on the surface of the MG;
cleaning the surface of the MG using a nitrogen/hydrogen (N$_2$/H$_2$) plasma to thereby reduce the second oxide layer to a metal included in the MG;
forming a barrier layer conformed to a bottom and walls of the trench;
depositing a metal layer on the barrier layer to fill the trench; and
performing a chemical mechanical polishing (CMP) process to form a contact metal in the trench, the contact metal and the dielectric layer being coplanar after the CMP process.

16. The method of claim 15, after the cleaning the surface of the MG using the N$_2$/H$_2$ plasma, further comprising:
performing an Ar sputtering process to expand an upper portion of the trench.

17. The method of claim 15, after the cleaning the surface of the MG using a H$_3$PO$_4$, solution, further comprising:
rinsing the IC structure using de-ionized water; and
spin drying the IC structure.

18. The method of claim 15, further comprising heating the IC structure at a temperature in a range from about 50° C. to about 500° C.

19. A method for forming an integrated circuit (IC) structure, comprising:
providing a metal gate (MG), an etch stop layer (ESL) formed on the MG, and a dielectric layer formed on the ESL;
etching the ESL and the dielectric layer to form a trench, a surface of the MG exposed in the trench being oxidized to form a first oxide layer on the MG; and
removing the first oxide layer using a H$_3$PO$_4$ solution;

transferring the IC structure to a deposition tool, the surface of the MG being oxidized to form a second oxide layer during the transfer;

baking the IC structure in the deposition tool at a temperature in a range from about 50° C. to about 500° C.;

reducing the second oxide layer to a metal included in the MG using a nitrogen/hydrogen ($N_2/H_2$) plasma in the deposition tool;

performing an Ar sputtering process to expand an upper portion of the trench in the deposition tool;

forming a barrier layer conformed to a bottom and walls of the trench in the deposition tool;

depositing a metal layer on the barrier layer to fill the trench in the deposition tool; and performing a chemical mechanical polishing (CMP) process to form a contact metal in the trench, the contact metal and the dielectric layer being coplanar after the CMP process.

20. The method of claim 19, wherein the MG includes aluminum (Al), and wherein the first oxide layer and the second oxide layer include $Al_2O_3$.

\* \* \* \* \*